US011128072B1

(12) United States Patent
Consoli et al.

(10) Patent No.: US 11,128,072 B1
(45) Date of Patent: Sep. 21, 2021

(54) ELECTRICAL CONNECTOR ASSEMBLY HAVING VARIABLE HEIGHT CONTACTS

(71) Applicant: TE Connectivity Services GmbH, Schaffhausen (CH)

(72) Inventors: John Joseph Consoli, Harrisburg, PA (US); Chad William Morgan, Carneys Point, NJ (US); Craig Warren Hornung, Harrisburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/935,512

(22) Filed: Jul. 22, 2020

(51) Int. Cl.
| H01R 12/00 | (2006.01) |
| H01R 12/71 | (2011.01) |
| H01R 12/52 | (2011.01) |
| H05K 7/10 | (2006.01) |
| H01R 13/24 | (2006.01) |

(52) U.S. Cl.
CPC .......... *H01R 12/714* (2013.01); *H01R 12/52* (2013.01); *H01R 12/716* (2013.01); *H01R 13/24* (2013.01); *H05K 7/1061* (2013.01); *H05K 2201/10378* (2013.01); *H05K 2201/10621* (2013.01)

(58) Field of Classification Search
CPC .... H01R 12/52; H01R 12/714; H01R 12/716; H01R 13/24; H05K 7/1061; H05K 2201/10378; H05K 2201/10621
USPC ..................................................... 439/65–75
See application file for complete search history.

(56) References Cited

U.S. PATENT DOCUMENTS

| 5,527,591 | A | 6/1996 | Crotzer et al. |
| 5,599,193 | A | 2/1997 | Crotzer |
| 5,600,099 | A | 2/1997 | Crotzer et al. |
| 5,766,021 | A | 6/1998 | Pickles et al. |
| 5,871,842 | A | 2/1999 | Crotzer et al. |
| 5,949,029 | A | 9/1999 | Crotzer et al. |
| 6,345,989 | B1 | 2/2002 | Mason et al. |
| 6,796,810 | B2 | 9/2004 | Delprete et al. |
| 7,391,227 | B2 | 6/2008 | Inoue et al. |
| 7,393,471 | B2 | 7/2008 | Inoue et al. |
| 7,448,883 | B2 | 11/2008 | Alden, III et al. |
| 7,549,870 | B2 | 6/2009 | Mason et al. |
| 7,585,173 | B2 | 9/2009 | Hilty et al. |
| 7,686,624 | B2 | 3/2010 | Mason et al. |
| 7,726,976 | B2 | 6/2010 | Mason et al. |
| 7,726,984 | B2 | 6/2010 | Bumb, Jr. et al. |
| 7,821,283 | B2 | 10/2010 | Yamada et al. |
| 7,878,818 | B2 | 2/2011 | Cheng et al. |
| 8,926,343 | B2 | 1/2015 | Mason et al. |
| 2020/0150148 | A1 | 5/2020 | Chung |

FOREIGN PATENT DOCUMENTS

| KR | 101393601 B1 | 5/2014 |
| KR | 101959536 B1 | 3/2019 |
| KR | 102113732 | 5/2020 |

*Primary Examiner* — Khiem M Nguyen

(57) ABSTRACT

An electrical connector assembly includes a carrier having an upper surface and a lower surface and having a plurality of contact openings therethrough. The electrical connector assembly includes contacts received in corresponding contact openings forming a contact array. Each contact has a conductive polymer column extending between an upper mating interface and a lower mating interface. The contacts in the contact array have variable heights to vary relative positions of at least one of the upper mating interfaces or the lower mating interfaces of the contacts.

20 Claims, 5 Drawing Sheets

ELECTRICAL CONNECTOR ASSEMBLY HAVING VARIABLE HEIGHT CONTACTS

BACKGROUND OF THE INVENTION

The subject matter herein relates generally to electrical connector assemblies.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a circuit board, thereby saving space on the circuit board.

One form of surface mount technology includes socket connectors. A socket connector may include a substrate holding an array of contacts. Some known socket connectors have beam contacts on one side of the substrate and conductive solder elements, such as a ball grid array (BGA), on the opposite side. The beam contacts engage contacts on the electronic package and the solder elements are affixed to conductive pads on a host circuit board, such as a mother board, to electrically join the electronic package with the host circuit board. The beam contacts are compressed during assembly for mating with the electronic package. Other known socket connectors include an array of conductive polymer columns that are compressible to provide an interposer between the host circuit board and the electronic package. However, known socket connectors have compression limits within a working range based on the properties of the materials of the contacts. When assembled, mechanical hardware is used for clamping the assembly together for electrical connection through the socket connector and for thermal connection of a heat sink to the electronic package. However, the pressure distribution across the parts of the assembly are not uniform across the parts. The non-uniformity of the pressure distribution caused by both mechanical forces and thermal stresses causes the parts to be distorted from a flat, planar state. With increasing density and decreasing height and pitch of contacts, the working range of contact deflection is decreasing. The distortion of the parts may be in excess of the working range of the contacts resulting in either reduced contact force and increased contact resistance, and may result in total loss of contact A need remains for an electrical connector assembly having improved contact interfaces with the upper and lower circuit boards.

BRIEF DESCRIPTION OF THE INVENTION

In an embodiment, an electrical connector assembly is provided. The electrical connector assembly includes a carrier having an upper surface and a lower surface. The lower surface is configured to face a host circuit board. The upper surface is configured to face a component circuit board of an electrical component. The carrier includes a plurality of contact openings therethrough. The electrical connector assembly includes contacts received in corresponding contact openings forming a contact array. Each contact has a conductive polymer column extending between an upper mating interface and a lower mating interface. The conductive polymer column is compressible between the upper mating interface and the lower mating interface. The contacts in the contact array have variable heights to vary relative positions of at least one of the upper mating interfaces or the lower mating interfaces of the contacts.

In another embodiment, an electrical connector assembly is provided. The electrical connector assembly includes a carrier having an upper surface and a lower surface. The lower surface is configured to face a host circuit board. The upper surface is configured to face a component circuit board of an electrical component. The carrier includes a plurality of contact openings therethrough. The electrical connector assembly includes contacts received in corresponding contact openings forming a contact array. Each contact has a conductive polymer column extending between an upper mating interface and a lower mating interface. The conductive polymer column is compressible between the upper mating interface and the lower mating interface. The conductive polymer columns are shaped such that the upper mating interfaces of the conductive polymer columns are non-coplanar.

In another embodiment, an electrical connector assembly is provided. The electrical connector assembly includes a carrier having an upper surface and a lower surface. The lower surface is configured to face a host circuit board. The upper surface is configured to face a component circuit board of an electrical component. The carrier includes a plurality of contact openings therethrough. The electrical connector assembly includes contacts received in corresponding contact openings forming a contact array. Each contact has a conductive polymer column extending between an upper mating interface and a lower mating interface. The conductive polymer column is compressible between the upper mating interface and the lower mating interface. The conductive polymer columns are shaped such that the upper mating interfaces of the conductive polymer columns are non-coplanar and such that the lower mating interfaces of the conductive polymer columns are non-coplanar.

DETAILED DESCRIPTION OF THE INVENTION

Figure 1:
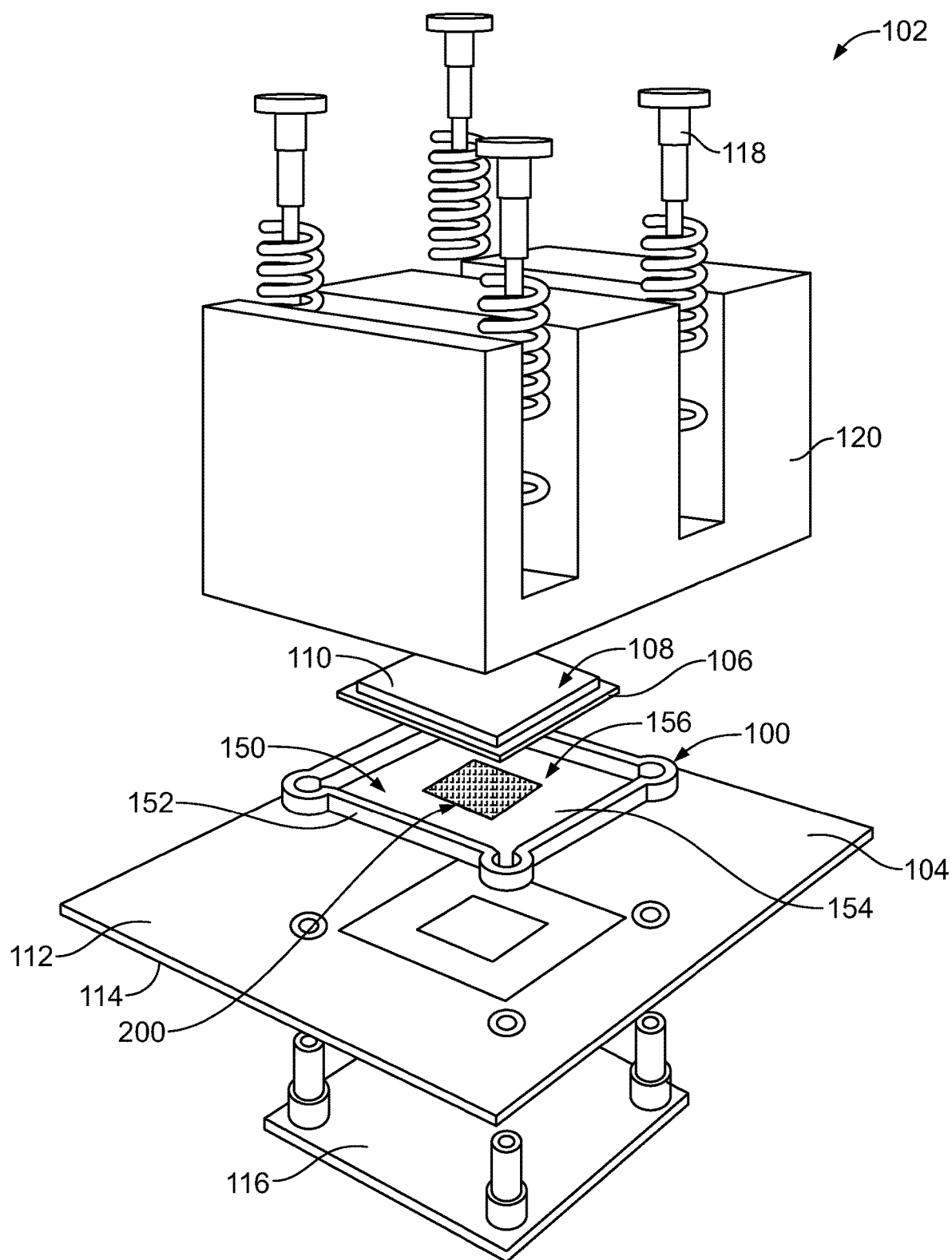
FIG. 1 is an exploded view of an electrical connector assembly in accordance with an exemplary embodiment for an electrical system.
Figure 2:
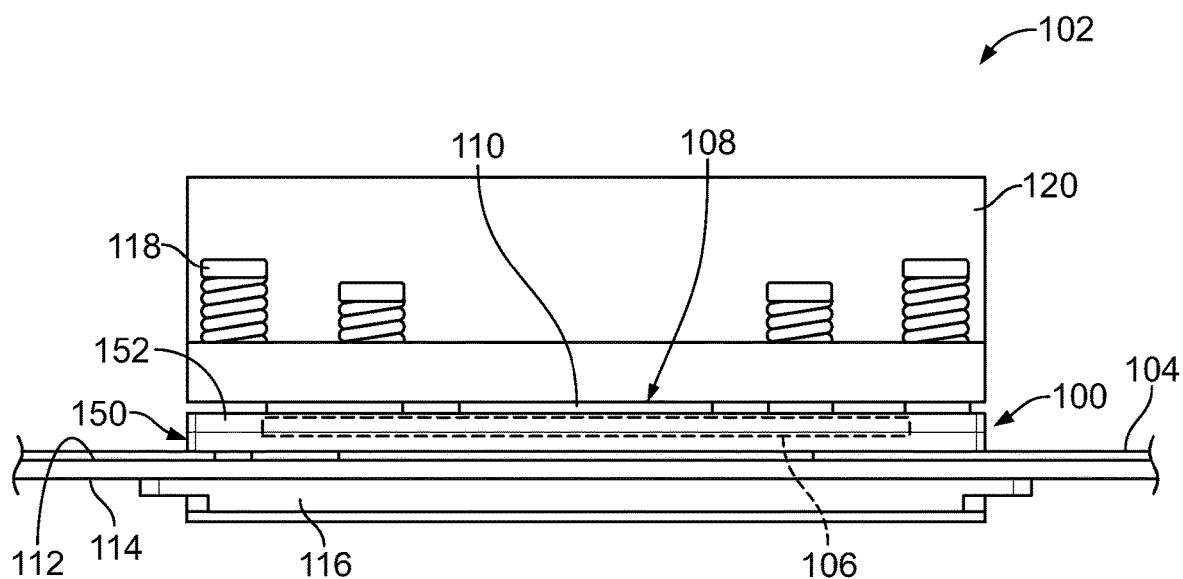
FIG. 2 is a side view of the electrical connector assembly of the electrical system in accordance with an exemplary embodiment.

FIG. 1 is an exploded view of an electrical connector assembly 100 in accordance with an exemplary embodiment for an electrical system 102. FIG. 2 is a side view of the electrical connector assembly 100 of the electrical system 102 in accordance with an exemplary embodiment. The electrical system 102 includes a host circuit board 104 and a component circuit board 106 (shown in phantom) of an electrical component 108. The electrical connector assembly 100 is used to electrically connect the component circuit board 106 with the host circuit board 104. In various embodiments, the electrical component 108 is an electronic package, such as an ASIC. For example, the electrical component 108 may include a chip 110 mounted to the component circuit board 106.

The host circuit board 104 includes an upper surface 112 and a lower surface 114. The electrical connector assembly 100 is mounted to the upper surface 112 of the host circuit board 104. In an exemplary embodiment, a backer plate 116 is provided at the lower surface 114 to stiffen the host circuit board 104. The electrical connector assembly 100 may be coupled to the backer plate 116 through the host circuit board 104, such as using fasteners 118.

In an exemplary embodiment, a thermal plate 120 (FIG. 1) is thermally coupled to the electrical component 108 to dissipate heat from the electrical component 108. For example, the plate 120 may be used to dissipate heat from the chip 110. The thermal plate 120 may be a heatsink or a cold plate in various embodiments. Other types of thermal plates may be used in alternative embodiments. The plate 120 may be coupled to the electrical connector assembly 100 and/or the host circuit board 104 and/or the backer plate 116 in various embodiments.

In an exemplary embodiment, the electrical connector assembly 100 includes an interposer 150 that holds a plurality of contacts 200. In an exemplary embodiment, the contacts 200 are conductive polymer contacts. The contacts 200 may be metallized particle interconnects. The contacts 200 are configured to be electrically connected to the host circuit board 104 and are configured to be electrically connected to the component circuit board 106 to transmit data signals therebetween. In various embodiments, the interposer 150 may hold other types of contacts, such as ground contacts and/or power contacts. The contacts are held in a contact array. In an exemplary embodiment, the array of contacts is configured to be coupled to the component circuit board 106 at a separable interface and configured to be coupled to the host circuit board 104 at a separable interface. For example, the contacts 200 may form a land grid array (LGA) interface with the component circuit board 106 and may form an LGA interface with the host circuit board 104.

In various embodiments, the electrical connector assembly 100 includes a support frame 152 holding the interposer 150 and configured to hold the electrical component 108. The support frame 152 may be a socket frame forming a socket that receives the electrical component 108. The interposer 150 includes a carrier 154 holding the contacts 200. The carrier 154 is coupled to the support frame 152. For example, the support frame 152 may include a socket opening 156 that receives the electrical component 108. The carrier 154 is held in the socket opening 156 for interfacing with the electrical component 108, such as the component circuit board 106. The support frame 152 is used to position the component circuit board 106 relative to the interposer 150 and the contacts 200. The support frame 152 may be secured to the host circuit board 104 and/or the backer plate 116 using fasteners 118. The thermal plate 120 may be coupled to the support frame 152. Optionally, the support frame 152 may position the thermal plate 120 relative to the electrical component 108, such as to limit compression of the thermal plate 120 against the electrical component 108. In alternative embodiments, the interposer 150 may be provided without the support frame 152.

Figure 3:
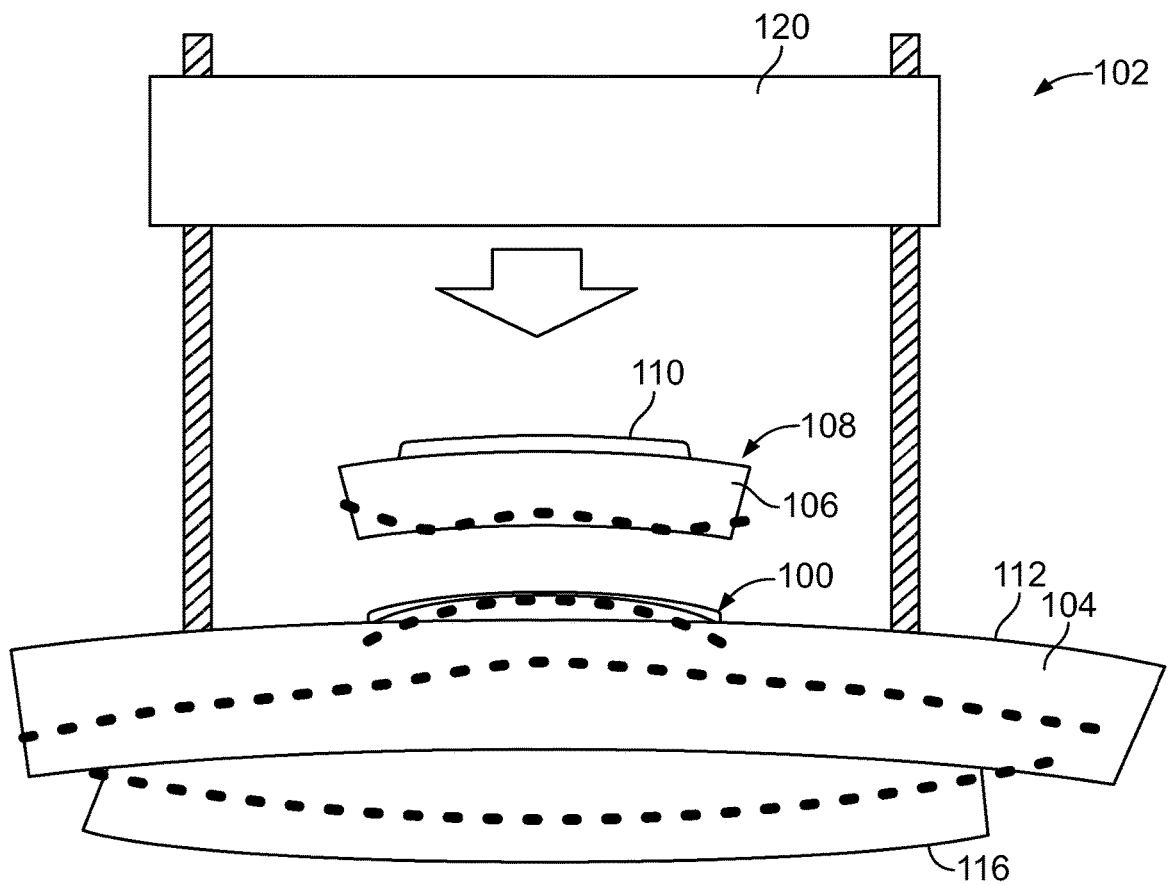
FIG. 3 is an exploded view of the electrical system in accordance with an exemplary embodiment.

FIG. 3 is an exploded view of the electrical system 102 in accordance with an exemplary embodiment. The electrical connector assembly 100 may be coupled to the upper surface 112 of the host circuit board 104. The electrical component 108 is configured to be coupled to the top of the electrical connector assembly 100. In an exemplary embodiment, the electrical connector assembly 100 includes a compressible interface for receiving the electrical component 108. The electrical connector assembly 100 is electrically connected to the chip 110 through the component circuit board 106. In an exemplary embodiment, the thermal plate 120 is coupled to the top of the chip 110 to dissipate heat from the chip 110. The backer plate 116 may be used to secure the thermal plate 120 and/or the electrical component 108 and/or the electrical connector assembly 100 to the host circuit board 104.

During manufacture and use, the host circuit board 104, the component circuit board 106 and the electrical connector assembly 100 are susceptible to warpage. For example, the mechanical compression used to hold the components together may cause warpage. Additionally or alternatively, during use, the components of the electrical system 102 may generate heat. Thermal expansion and contraction may cause additional warpage of the components. The warpage leads to non-planarity of the host circuit board 104 at the interface with the electrical connector assembly 100 and/or non-planarity of the component circuit board 106 at the interface with the electrical connector assembly 100.

In an exemplary embodiment, the contacts 200 of the electrical connector assembly 100 are designed to accommodate a certain amount of warpage. For example, the heights of the contacts 200 may be varied to accommodate for the warpage. The warpage may be non-uniform across the interfaces. For example, the area near the center of the electrical connector assembly 100 or the areas at the sides of the electrical assembly 100 may experience greater warpage than other areas. The warpage profile of the host circuit board 104 and/or the component circuit board 106 may be generally known based on the contact layout.

In an exemplary embodiment, the electrical connector assembly 100 may be designed to accommodate for the expected warpage profile. For example, the contacts 200 may be lengthened in certain areas or shortened in certain areas to accommodate for the expected warpage profile of the host circuit board 104 and/or the component circuit board 106. In an exemplary embodiment, the heights of the contacts 200 may be controlled by adjusting the forming molds used for forming the contacts 200 to achieve longer or shorter contacts 200 as desired at predetermined areas or locations within the electrical connector assembly 100.

Figure 4:
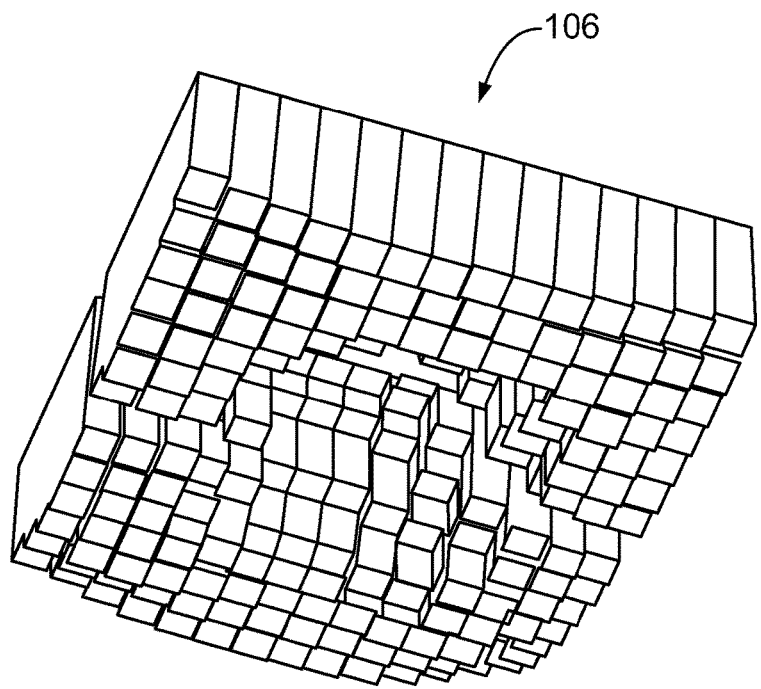
FIG. 4 shows a warpage profile of a component circuit board of the electrical system in accordance with an exemplary embodiment.
Figure 5:
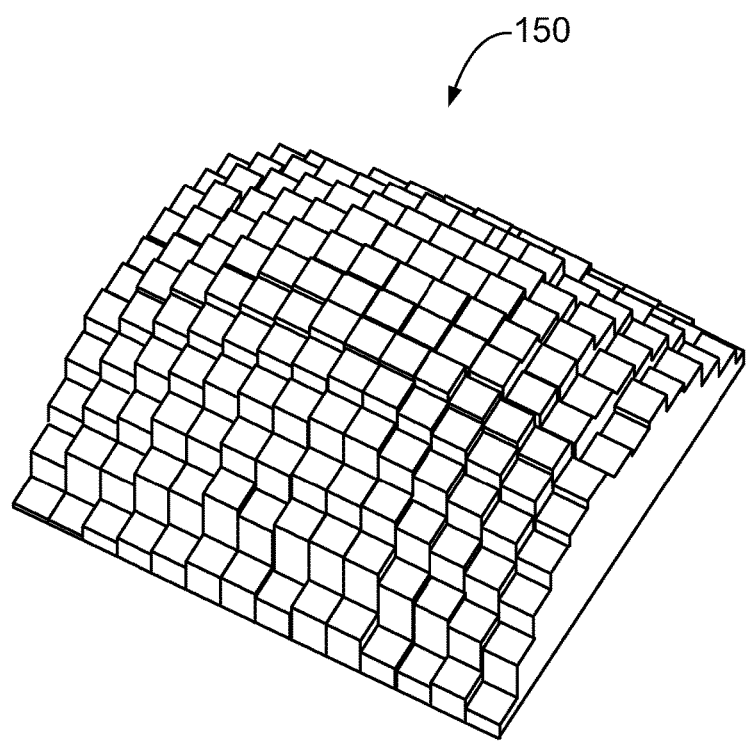
FIG. 5 shows a contact profile of an interposer of the electrical connector assembly in accordance with an exemplary embodiment that is complimentary to the component circuit board warpage.

FIG. 4 shows a warpage profile of the component circuit board 106 in accordance with an exemplary embodiment. FIG. 5 shows a contact profile of the interposer 150 in accordance with an exemplary embodiment that is complimentary to the component circuit board warpage. The profiles are exaggerated in FIGS. 4 and 5 to illustrate the warpage and the need for the variable height contact profile. In the illustrated embodiment, the warpage profile of the component circuit board 106 is concave near the center of the component circuit board 106. The contact profile is elevated near the center and shorter near the outer sides to compliment the shape of the warpage profile.

Figure 6:
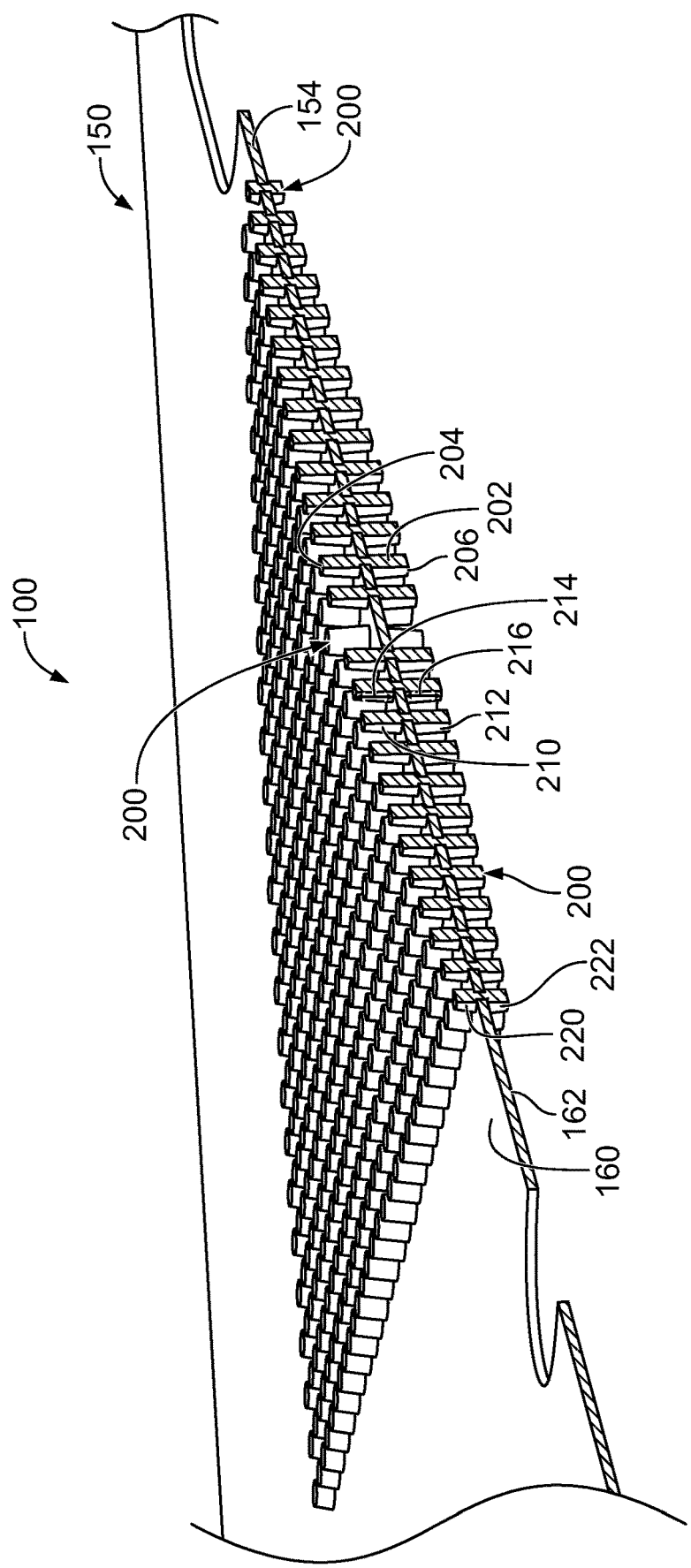
FIG. 6 is a partial sectional view of a portion of the electrical connector assembly in accordance with an exemplary embodiment.
Figure 7:
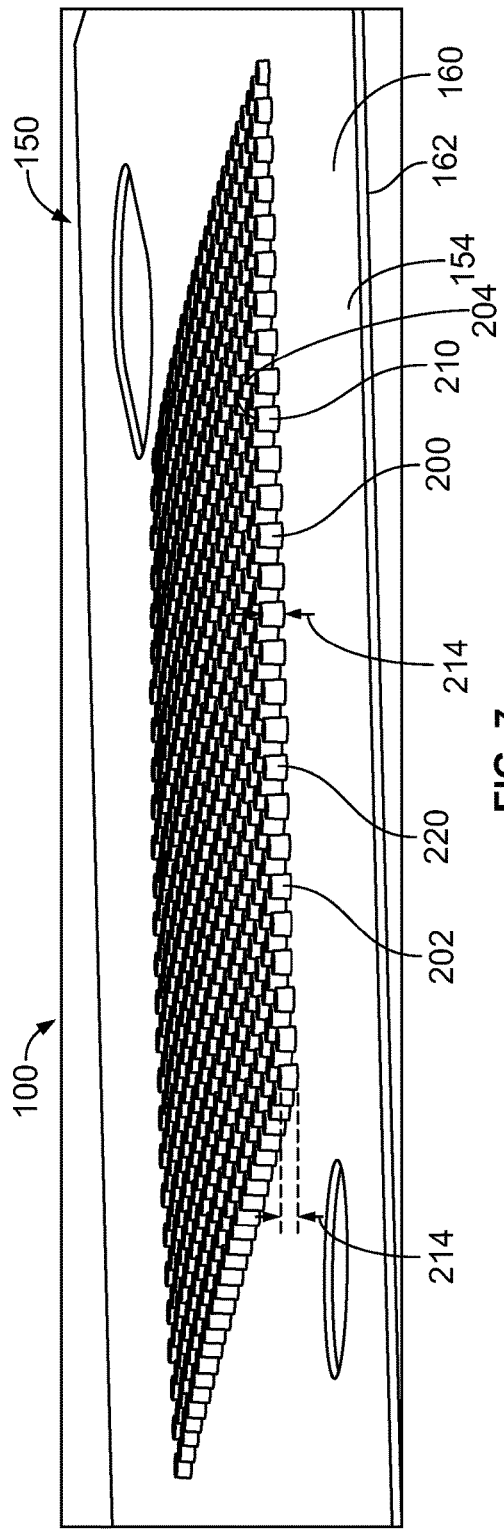
FIG. 7 is a top perspective view of a portion of the electrical connector assembly in accordance with an exemplary embodiment.
Figure 8:
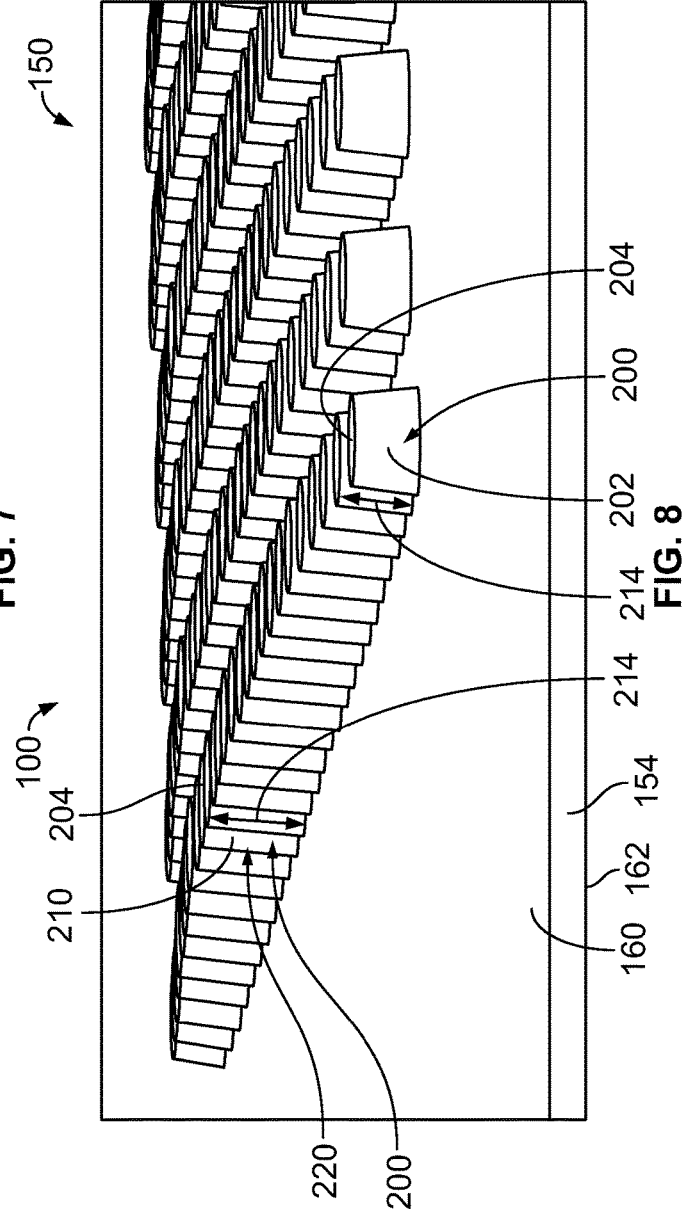
FIG. 8 is a top perspective view of a portion of the electrical connector assembly in accordance with an exemplary embodiment.

FIG. 6 is a partial sectional view of a portion of the electrical connector assembly 100 in accordance with an exemplary embodiment. FIG. 7 is a top perspective view of a portion of the electrical connector assembly 100 in accordance with an exemplary embodiment. FIG. 8 is a top perspective view of a portion of the electrical connector assembly 100 in accordance with an exemplary embodiment. FIGS. 6-8 illustrate the interposer 150 showing an array of the contacts 200.

The interposer 150 includes the carrier 154 holding the contacts 200. The carrier 154 may be a plate or film that supports the contacts 200. The carrier 154 is manufactured from a dielectric material to electrically isolate the contacts 200. For example, the carrier 154 may be a polyimide film. The carrier 154 includes an upper surface 160 and a lower surface 162. The lower surface 162 is configured to face the host circuit board 104 (shown in FIG. 3). The upper surface 160 is configured to face the electrical component 108 (shown in FIG. 3). The carrier 154 includes a plurality of contact openings extending between the upper surface 160 and the lower surface 162. The contact openings receive the contacts 200.

In an exemplary embodiment, each contact 200 includes a conductive polymer column 202 extending between an upper mating interface 204 at the top of the contact 200 and a lower mating interface 206 at the bottom of the contact 200. The upper and lower mating interfaces 204, 206 form separable mating interfaces. The upper and lower mating interfaces 204, 206 may form upper and lower LGAs. The conductive polymer column 202 is a metallized particle interconnect in various embodiments. For example, the conductive polymer column 202 is a conductive polymer composite structure. The conductive polymer column 202 is manufactured from a polymer material having conductive particles, such as silver particles, embedded in the polymer base material. The conductive polymer may be internally conductive through the conductive polymer column 202. The conductive polymer column 202 may be plated or coated to be electrically conductive along the exterior surface. The conductive polymer column 202 may include conductive caps at the upper and lower mating interfaces 204, 206.

In an exemplary embodiment, heights of the contacts 200 may be varied relative to other contacts 200. For example, the upper mating interfaces 204 may be non-coplanar and/or the lower mating interfaces 206 may be non-coplanar. The heights of the contacts 200 are varied to control or adjust vertical positions of the upper mating interfaces 204 and/or the lower mating interfaces 206. The vertical positions of the upper mating interfaces 204 may be varied relative to the upper surface 160 of the carrier 154, such as for matching the expected warpage profile of the component circuit board 106. The vertical positions of the lower mating interfaces 206 may be varied relative to the lower surface 162 of the carrier 154, such as for matching the expected warpage profile of the host circuit board 104.

The contacts 200 are arranged in the contact array based on the heights of the conductive polymer columns 202 to control vertical positions of at least one of the upper mating interfaces 204 and/or the lower mating interfaces 206 to correspond to warpage profiles of the component circuit board 106 or the host circuit board 104. The contact array of contacts 200 forms a contoured contact field having a non-coplanar geometry. For example, the contact array of contacts have a non-coplanar height profile having an inverse shape of the non-coplanar warpage profile of the component circuit board 106 or the host circuit board 104. Optionally, the contacts 200 may be arranged in different arrays (for example, groups, rows, columns, and the like) having different heights. The contacts 200 in the different contact arrays may have different, non-overlapping height ranges.

In an exemplary embodiment, the conductive polymer column 202 of each contact 200 includes an upper portion 210 above the upper surface 160 of the carrier 154 and a lower portion 212 below the lower surface 162 of the carrier 154. The upper portion 210 extends between the upper surface 160 and the upper mating interface 204. The lower portion 212 extends between the lower surface 162 and the lower mating interface 206. The upper portion 210 has an upper portion height 214 between the upper surface 160 and the upper mating interface 204. The lower portion 212 has a lower portion height 216 between the lower surface 162 and the lower mating interface 206. The upper portion heights 214 may be variable. The lower portion heights 216 may be variable. The upper portion heights 214 may be identical to the corresponding lower portion heights 216 of the same conductive polymer column 202 in various embodiments. The upper portion heights 214 may be different than the lower portion heights 216 of the same conductive polymer column 202 in alternative embodiments. In the illustrated embodiment, the contacts 200 near the middle of the array are taller and the contacts 200 near the outer edges are shorter. The contacts 200 have gradually varying heights (for example, each adjacent contact 200 having a different height) from the middle to the outer edges. Alternatively, the heights of the contacts 200 may be stepped in groups rather than being gradually varying. Other contact array profiles may be provided in alternative embodiments, such as being shorter near the middle and taller at the outer edges.

In an exemplary embodiment, the conductive polymer columns 202 are frustoconical shaped. For example, the upper portion 210 is frustoconical shaped and the lower portion 212 is frustoconical shaped. For example, an upper portion wall 220 is tapered between the upper surface 160 and the upper mating interface 204 and a lower portion wall 222 is tapered between the lower surface 162 and the lower mating interface 206. The conductive polymer columns 202 are shaped such that the upper mating interfaces 204 are non-coplanar and/or such that the lower mating interfaces 206 are non-coplanar. The upper portion 210 has a first upper diameter at the upper surface 160 and a second upper diameter at the upper mating interface 204 less than the first upper diameter. The lower portion 212 has a first lower diameter at the lower surface 162 and a second lower diameter at the lower mating interface 206 less than the first lower diameter. Optionally, all of the conductive polymer columns 202 have equal first upper diameters and equal second upper diameters. The angle of taper of the upper portion walls 220 may be varied for the different height contacts 200. Alternatively, the angle of taper of the upper portion walls 220 may be the same for all of the contacts 200, but the first upper diameters and/or the second upper diameters may be different. Optionally, all of the conductive polymer columns 202 have equal first lower diameters and equal second lower diameters. The angle of taper of the lower portion walls 222 may be varied for the different height contacts 200. Alternatively, the angle of taper of the lower portion walls 222 may be the same for all of the contacts 200, but the first lower diameters and/or the second lower diameters may be different.

The above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector assembly comprising:
a carrier having an upper surface and a lower surface, the lower surface configured to face a host circuit board, the upper surface configured to face a component circuit board of an electrical component, the carrier including a plurality of contact openings therethrough;
contacts received in corresponding contact openings forming a contact array, each contact having a conductive polymer column extending between a upper mating interface and a lower mating interface, the conductive polymer column being compressible between the upper mating interface and the lower mating interface, the contacts in the contact array having variable heights to vary relative positions of at least one of the upper mating interfaces or the lower mating interfaces of the contacts.

2. The electrical connector assembly of claim 1, wherein the conductive polymer columns are shaped such that the upper mating interfaces of the conductive polymer columns are non-coplanar.

3. The electrical connector assembly of claim 1, wherein the conductive polymer columns are shaped such that the upper mating interfaces of the conductive polymer columns are non-coplanar and such that the lower mating interfaces of the conductive polymer columns are non-coplanar.

4. The electrical connector assembly of claim 1, wherein each contact includes an upper portion between the upper surface of the carrier and the upper mating interface and includes a lower portion between the lower surface of the carrier and the lower mating interface, the upper portion having a first upper diameter at the upper surface and having a second upper diameter at the upper mating interface less than the first upper diameter with a tapered upper portion wall between the upper surface and the upper mating interface, the lower portion having a first lower diameter at the lower surface and having a second lower diameter at the lower mating interface less than the first lower diameter with a tapered lower portion wall between the lower surface and the lower mating interface.

5. The electrical connector assembly of claim 4, wherein the contact array of contacts includes a first contact and a second contact having different heights, a taper angle of the upper portion wall of the first contact is different than a taper angle of the upper portion wall of the second contact.

6. The electrical connector assembly of claim 1, wherein the contacts are arranged in the contact array based on the heights of the conductive polymer columns to control vertical positions of at least one of the upper mating interfaces or the lower mating interfaces to correspond to a warpage profile of at least one of the host circuit board or the component circuit board.

7. The electrical connector assembly of claim 1, wherein the contact array of contacts form a contoured contact field having a non-coplanar geometry.

8. The electrical connector assembly of claim 1, wherein the contact array of contacts having a non-coplanar height profile having an inverse shape of the non-coplanar warpage profile of at least one of the host circuit board or the component circuit board.

9. The electrical connector assembly of claim 1, wherein the contacts are arranged in a first contact array and a second contact array, the contacts in the first contact array having a first height, the contacts in the second contact array having a second height different than the first height.

10. The electrical connector assembly of claim 9, wherein the contacts are further arranged in a third contact array, the contacts in the third contact array having a third height different than the first height and different than the second height.

11. The electrical connector assembly of claim 1, wherein the contacts are arranged in a first contact array and a second contact array, all of the contacts in the first contact array having heights in a first height range and all of the contacts in the second contact array having heights in a second height range nonoverlapping with the first height range.

12. An electrical connector assembly comprising:
a carrier having an upper surface and a lower surface, the lower surface configured to face a host circuit board, the upper surface configured to face a component circuit board of an electrical component, the carrier including a plurality of contact openings therethrough;
contacts received in corresponding contact openings forming a contact array, each contact having a conductive polymer column extending between a upper mating interface and a lower mating interface, the conductive polymer column being compressible between the upper mating interface and the lower mating interface, the conductive polymer columns being shaped such that the upper mating interfaces of the conductive polymer columns are non-coplanar.

13. The electrical connector assembly of claim 1, wherein the lower mating interfaces of the conductive polymer columns are coplanar.

14. The electrical connector assembly of claim 1, wherein the lower mating interfaces of the conductive polymer columns are non-coplanar.

15. The electrical connector assembly of claim 1, wherein the contacts are arranged in the contact array based on the heights of the conductive polymer columns to control vertical positions of the upper mating interfaces to correspond to a warpage profile of the component circuit board.

16. The electrical connector assembly of claim 1, wherein the contact array of contacts having a non-coplanar height profile having an inverse shape of the non-coplanar warpage profile of the component circuit board.

17. The electrical connector assembly of claim 1, wherein the contacts are arranged in a first contact array and a second contact array, the contacts in the first contact array having a first height, the contacts in the second contact array having a second height different than the first height.

18. An electrical connector assembly comprising:
a carrier having an upper surface and a lower surface, the lower surface configured to face a host circuit board, the upper surface configured to face a component circuit board of an electrical component, the carrier including a plurality of contact openings therethrough;
contacts received in corresponding contact openings forming a contact array, each contact having a conductive polymer column extending between a upper mating interface and a lower mating interface, the conductive polymer column being compressible between the upper mating interface and the lower mating interface, the conductive polymer columns being shaped such that the upper mating interfaces of the conductive polymer columns are non-coplanar and such that the lower mating interfaces of the conductive polymer columns are non-coplanar.

19. The electrical connector assembly of claim 1, wherein the contacts are arranged in the contact array based on the heights of the conductive polymer columns to control vertical positions of the upper mating interfaces to correspond to a warpage profile of the component circuit board and to control vertical positions of the lower mating interfaces to correspond to a warpage profile of the host circuit board.

20. The electrical connector assembly of claim 1, wherein the upper mating interfaces of the contacts have a non-coplanar height profile having an inverse shape of the non-coplanar warpage profile of the component circuit board and wherein the lower mating interfaces of the contacts have a non-coplanar height profile having an inverse shape of the non-coplanar warpage profile of the host circuit board.

\* \* \* \* \*